United States Patent [19]

Takada et al.

[11] Patent Number: 4,643,798
[45] Date of Patent: Feb. 17, 1987

[54] COMPOSITE AND CIRCUIT BOARD HAVING CONDUCTIVE LAYER ON RESIN LAYER AND METHOD OF MANUFACTURING

[75] Inventors: Mitsuyuki Takada; Yoshiyuki Morihiro; Hayato Takasago, all of Amagasaki, Japan

[73] Assignee: Mitsubishi Denki Kabushiki Kaisha, Tokyo, Japan

[21] Appl. No.: 721,460

[22] Filed: Apr. 9, 1985

[30] Foreign Application Priority Data

Aug. 7, 1984 [JP] Japan ............... 59-165410

[51] Int. Cl.⁴ ............... B44C 1/22; C03C 15/00
[52] U.S. Cl. ............... 156/630; 156/635; 156/650; 156/652; 156/656; 427/307; 427/314
[58] Field of Search ............... 156/650, 652, 656, 657, 156/630, 635, 655, 659.1; 430/315, 324, 328, 330; 427/307, 308, 314, 316

[56] References Cited

U.S. PATENT DOCUMENTS

| | | | |
|---|---|---|---|
| 3,801,427 | 4/1974 | Morishita et al. | 161/162 |
| 4,317,856 | 3/1982 | Huthwelker et al. | 428/273 |
| 4,349,421 | 9/1982 | Khattab | 204/38 B |
| 4,410,394 | 10/1983 | Stalcup et al. | 156/630 |
| 4,475,983 | 10/1984 | Bader et al. | 156/656 |
| 4,521,475 | 6/1985 | Riccio et al. | 428/142 |

FOREIGN PATENT DOCUMENTS 0056093 7/1982 Fed. Rep. of Germany .

Primary Examiner—John E. Kittle
Assistant Examiner—Patrick Ryan
Attorney, Agent, or Firm—Lowe Price LeBlanc Becker & Shur

[57] ABSTRACT

In manufacturing a composite having a conductive layer on the surface of a resin layer, first the resin layer of a mixture of a resin material and filler elements is formed on a substrate and the resin material of the surface of the resin layer is selectively etched with respect to the filler elements to expose a portion of the filler elements, and then the filler elements, as exposed on the selectively etched surface of the resin layer, are selectively etched with respect to the resin material to form unevenness. Then catalyst nuclei are formed for electroless plating on the selectively etched surface having the unevenness and then a conductive metallic layer is formed by an electroless plating process on the selectively etched surface having unevenness. As a result, a composite of the above described structure is provided.

14 Claims, 8 Drawing Figures

COMPOSITE AND CIRCUIT BOARD HAVING CONDUCTIVE LAYER ON RESIN LAYER AND METHOD OF MANUFACTURING

BACKGROUND OF THE INVENTION

1. Field of the Invention

The present invention relates to a composite and a circuit board having a conductive layer on a resin layer and a method of manufacturing the same. More specifically, the present invention relates to improvements in a composite and a circuit board having a conductive layer formed through electroless plating on a resin layer and a method of manufacturing the same.

2. Description of the Prior Art

Conventionally known methods of manufacturing a composite having a conductive layer formed on a resin layer comprise a method of forming a metallic thin film on the surface of a resin layer utilizing a thin film forming technology such as evaporation, sputtering and the like, a method of forming a metallic layer on the surface of a resin layer by depositing catalyst nuclei for deposition of an electroless plated layer on the surface of the resin layer by immersing the same in an electroless plating bath, and the like. The conductive layer thus formed through such a thin film forming technology is as thick as several $\mu$m at the largest. Accordingly, in using the conductive layer as a conductor of a circuit board, the impedance cannot be made small due to a small thickness thereof. In addition, generally a thin film forming process is disadvantageous in terms of productivity and cost as compared with other film forming processes, such as thick film forming process. Therefore, the thin film forming process has been merely utilized in the field where fine patterns are required, such as in manufacture of electronic devices such as circuit boards, magnetic heads and the like for use in industrial electronic machines.

Typical applications of formation of a conductive layer by electroless plating are plating of a conductive layer onto a through hole of a printed circuit board of a resin material, and the like. Other applications of electroless plating comprise a well-known full additive method for forming a circuit by forming a conductive layer of a thickness larger than 10 $\mu$m by electroless plating only on a desired portion of a circuit board, and the like. In forming a conductive layer on a resin layer by electroless plating, the surface of the resin layer is processed to make uneven in order to enhance adhesion of the conductive layer onto the surface of the resin layer. Known methods for making the uneven (coarse) surface of the resin layers comprise a method of making the uneven surface in a mechanical manner, and a method of making the uneven surface through etching by chemicals, plasma and the like. However, the mechanical method involves less uniformity in an uneven state of the surface and the degree of unevenness is relatively large, with the result that the adhesion of a conductive layer to the surface of the resin layer is diversified particularly in case of a fine pattern of the conductive layer. On the other hand, the etching method by chemical or plasma involves a disadvantage that productivity is poor and the degree of unevenness is small.

An example of application of the conventional method of manufacturing a composite having a conductive layer on a resin layer is manufacture of a printed circuit board. Conventionally known methods of manufacturing a printed circuit board comprise a subtract method of forming a circuit by etching a copper foil laminated board, an additive method of forming only a desired circuit portion on a catalyst covered insulating board by a plating process, and the like. However, the former subtract method involves disadvantages that the amount of copper dissolved and removed by etching is much more than the amount of copper left to form a circuit, resulting in a waste of resource, and processes of forming an etching resist, etching and the like are complicated, with the result that difficulty is involved in uniformity of precision of the circuit pattern and realization of fine circuit patterns. On the other hand, the latter additive process comprises the step of forming a circuit pattern by plating a conductive layer only on a required circuit portion and is excellent from the standpoint of effective utilization of resource; however, the same also involves the difficulties that a specific resist having excellent durability to a plating solution is required since a plating process, usually an electroless plating process, is required for a long period of time, and the said resist layer need be formed on an insulating board in accordance with a circuit pattern by using a screen process, which is liable to cause inconvenience such as a bridge, an opened portion and the like of a printed pattern depending on the printing condition, thereby to make it difficult to realize a fine pattern. Another method is also proposed in which a concaved portion is formed on an insulating board using a pressing mold, whereupon a conductive paste is filled in the concave to form a circuit. Although this method is good in mass production of printed circuit boards of the same type, this method is not preferred in production of a less number of printed circuit boards having a number of types in that a number of pressing molds are required depending on the circuit patterns. In addition, in filling a conductive paste in the concaves, voids, bridges of the circuits and the like are likely to occur, so that deterioration of the electrical characteristic is unavoidable.

SUMMARY OF THE INVENTION

Accordingly, a principal object of the present invention is to provide a composite and a circuit board having a conductive layer of an increased thickness on the surface of a resin layer with an increased adhesion of the conductive layer to the resin layer, which can be manufactured with excellent productivity.

Briefly described, the present invention comprises a composite having a conductive layer on the surface of a resin layer, which comprises a substrate, a resin layer formed on the substrate and comprising a mixture of a resin material and filler elements of fine geometry, the resin material being selectively etchable with respect to the filler elements and the filler elements being selectively etchable with respect to the resin material, the resin layer having a selectively etched surface formed by selective etching thereof with respect to the filler elements, and concavities formed on the selectively etched surface of the resin layer by selective etching of the filler elements, as exposed, with respect to the resin material, and a conductive metallic layer formed on the selectively etched surface and inside the concavities of the resin layer through electroless plating.

In manufacturing such composite, first the resin layer is formed on the substrate and the resin material of the surface of the resin layer is selectively etched with respect to the filler elements to expose a portion of the filler elements, and then the filler elements, as exposed on the selectively etched surface of the resin layer, are selectively etched with respect to the resin material to form unevenness. Then catalyst nuclei are formed for electroless plating on the selectively etched surface having the unevenness and then a conductive metallic layer is formed by an electroless plating process on the selectively etched surface having unevenness. As a result, a composite of the above described structure is provided.

In implementing the inventive composite, selective etching of the surface of the resin layer may be restricted to a predetermined pattern and formation of a conductive metal layer may be accordingly restricted to the predetermined pattern. As a result, a circuit board having a conductive layer of a predetermined pattern on the surface of a resin layer is provided.

Accordingly, the present invention also comprises a circuit board having a conductive layer of a predetermined pattern on the surface of a resin layer, which comprises a substrate, a resin layer formed on the substrate and comprising a mixture of a resin material and filler elements of fine geometry, the resin material being selectively etchable with respect to the filler elements and the filler elements being selectively etchable with respect to the resin material, the resin layer having a selectively etched surface formed in a predetermined pattern by selective etching thereof with respect to the filler elements, and concavities formed on the selectively etched surface in the predetermined pattern of the resin layer by etching of the filler elements, as exposed, with respect to the resin material, and a conductive metallic layer selectively formed on the selectively etched surface in the predetermined pattern and inside the concavities of the resin layer through electroless plating.

In manufacturing the inventive circuit board, the resin layer is formed on the substrate and the resin material of an area in a predetermined pattern of the surface of the resin layer is selectively etched with respect to the filler elements to expose a portion of the filler elements of the area in the predetermined pattern of the surface of the resin layer and then the filler elements, as exposed on the selectively etched surface of the area in the predetermined pattern of the resin layer are selectively etched to form unevenness including concavities formed by etching of the exposed filler elements. Catalyst nuclei for electroless plating are formed on the selectively etched surface in the predetermined pattern of the resin layer having the unevenness and then a conductive metallic layer is formed on the selectively etched surface in the predetermined pattern by electroless plating. As a result, a circuit board of the above described structure is provided.

In accordance with an embodiment, the filler elements are made of an inorganic insulating material. An example of the filler elements of the inorganic insulating material comprises glass granules. Another example of the filler elements of the inorganic insulating material comprises crystal of the inorganic insulating material. A further example of the filler elements of the inorganic insulating material comprises glass fibers.

In accordance with another embodiment of the present invention, the filler elements are made of metal. The filler elements of metal may be copper granule or aluminum granules. According to the embodiment, thermal conductivity of the resin material can be enhanced, as necessary.

In accordance with a further embodiment of the present invention, the resin material comprises a thermo-setting material being thermo-settable at a predetermined thermo-setting temperature, wherein the resin material is selectively etchable with respect to the filler elements when the resin material has not been thermo-set, while the filler elements are selectively etchable with respect to the resin material when the resin material has been thermo-set, and the resin material is heated to the predetermined thermo-setting temperature after the resin material of the surface of said resin layer is selectively etched and before the filler elements, as exposed, are selectively etched.

These objects and other objects, features, aspects and advantages of the present invention will become more apparent from the following detailed description of the present invention when taken in conjunction with the accompanying drawings.

DESCRIPTION OF THE PREFERRED EMBODIMENTS

First a method of manufacturing a composite having a conductive layer on the surface of a resin layer in accordance with the first and second embodiments of the present invention will be described.

FIRST EMBODIMENT

Figure 1:
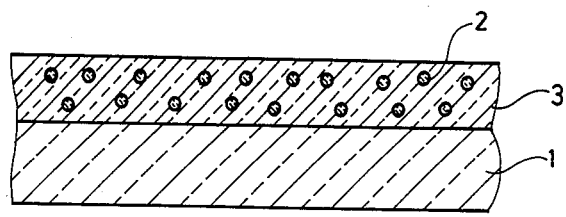
FIGS. 1 to 4 are sectional views of a composite at various steps of a manufacturing process in accordance with the present invention.
Figure 2:
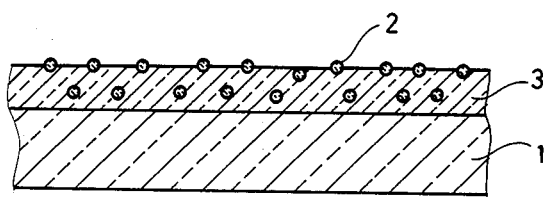
Figure 3:
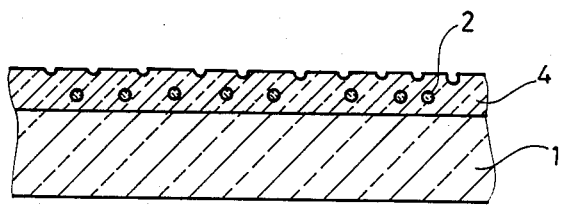
Figure 4:
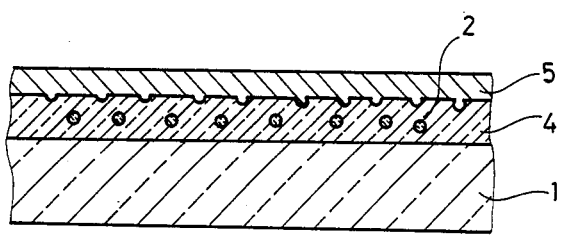

FIGS. 1 to 4 are sectional views of such composite at various steps of a manufacturing process in accordance with the first embodiment of the present invention. More specifically, FIG. 1 is a sectional view of the composite comprising a resin layer of a mixture of a resin material and filler elements of fine geometry formed on a substrate before the surface of the resin layer is etched, FIG. 2 is a sectional view of the composite after the surface of the resin layer is etched to expose a portion of the filler elements, FIG. 3 is a sectional view of the composite after the exposed filler elements are etched, and FIG. 4 is a sectional view of the composite with a conductive metallic layer formed on the etched surface of the resin layer. Referring to FIGS. 1 to 4, the reference numeral 1 denotes a substrate, which may comprise an alumina ceramic substrate, the reference numeral 2 denotes granules of an inorganic insulating material, which may comprise glass granules, the reference numeral 3 denotes a resin material before thermal setting, which may comprise photosensitive polyimide precursor, the reference numeral 4 denotes the resin material after thermal setting, which may comprise polyimide resin, and the reference numeral 5 denotes a conductive metallic layer formed by an electroless plating method, which may comprise copper.

Now referring to FIGS. 1 to 4, a method of manufacturing a composite having a conductive layer on the surface of a resin layer in accordance with the first embodiment of the present invention will be described. First a mixture is prepared by mixing a resin material 3 of polyimide carboxylic acid system varnish with filler elements 2 of glass granules of approximately 10 μm in granular diameter at volumetric ratio of two times with respect to polyimide precursor. The glass granules are a type of being readily dissoluble by acid. The mixture of polyimide precursor 3 with glass granules 2 is coated on the alumina ceramic substrate 1. The polyimide carboxylic acid system varnish 3 is dried at a temperature lower than a setting temperature, in this case at 80° C., for thirty minutes. The resin layer of the mixture is then partially exposed to light in a predetermined pattern and the surface of the resin layer is slightly removed in such pattern using as an etchant an organic solvent, such as N-methyl-2-pyrolidone. As a result, the composite of such a structure as shown in FIG. 2 is obtained, wherein a portion of the glass granules 2 are exposed. Then the composite is heated at 350° C. so that the resin material may be thermally set by a change from polyimide carboxylic acid system varnish 3 to polyimide resin 4. The composite thus obtained is then subjected to an etching process by immersing the same in acid such as fluoric acid, so that the portion of the glass granules 2, as exposed, may be selectively etched with respect to the polyimide resin 4. As a result, the composite of such a structure as shown in FIG. 3 is obtained, wherein the surface of the polyimide resin layer 4 is uneven, including small concavities. Then catalyst nuclei are formed on the uneven surface of the polyimide resin layer 4 for deposition of a conductive metallic layer through electroless plating and then the composite is immersed in an electroless plating bath. As a result, the composite of a structure as shown in FIG. 4 is provided.

It was observed that the composite thus obtained has an excellent adhesion of the conductive metallic layer to the resin layer because of an increased area of contact between the surface of the resin layer and the conductive metallic layer. It was also observed that the inventive process is carried out readily on a mass production basis and hence with excellent productivity.

Although in the foregoing embodiment polyimide resin as thermally set of polyimide carboxylic acid system varnish was employed as a resin material of the resin layer, any other resin material may be used which can be coated in a varnish state and can be etched by a suitable etchant after the same is dried and is excellent in anti-chemical property after thermal setting. For example, such material may comprise polyisoprene resin, phenol novolak resin, polymethacrylate resin, and the like and photosensitivity is not necessarily required.

In the foregoing embodiment, glass granules were used as an inorganic insulating material. However, the inorganic insulating material may comprise crystal of any other type of an inorganic insulating material which can be selectively etched without corroding the resin material of the resin layer and has heat resisting property at the resin thermo-setting temperature (such as metal oxide of magnesium oxide, stannum oxide or the like). The filler elements of an inorganic insulating material may be in the form of granules but also in the form of fibers in order to achieve the same effect.

Since the degree of unevenness on the surface of the resin layer can be readily controlled by changing the diameter of granules, the temperature, the geometry and the etching conditions of the inorganic insulating material to be mixed in the resin material and as a result any desired surface conditions can be readily achieved.

The above described enhancement of the adhesion of the conductive metallic layer to the resin layer reduces a possibility of peeling off of the conductive metallic layer in case where the thickness of the conductive metallic layer is increased. As a result, formation of a conductive metallic layer in an increased thickness through electroless plating or additional electroplating on an electroless plated layer can be readily achieved. Furthermore, the uneven conditions of the resin layer can be controlled to be suited for a fine pattern and hence the adhesion can be further enhanced.

SECOND EMBODIMENT

In the above described embodiment of the present invention, an inorganic insulating material such as glass or metal oxide of such magnesium oxide, stannum oxide or the like in the form of granules or fibers was employed as the filler elements of fine geometry. However, this should be taken by way of example and not by way of limitation, inasmuch as substantially the same effect can be achieved by using metal in the form of granules or fibers as the filler elements of fine geometry. Such an embodiment of the present invention as employing metal as the filler elements of fine geometry will be described in the following. Since the second embodiment of the present invention is similar to the first embodiment, except for employment of metal as a material of the filler elements in the second embodiment in place of the inorganic insulating material in the first embodiment of the present invention, the second embodiment will be described with reference to FIGS. 1 to 4 centering on such differences.

More specifically, in the second embodiment the filler elements of fine geometry to be mixed with the resin material for the resin layer may comprise metal granules in place of glass granules in the previously described first embodiment of the present invention. Preferably the metal granules may comprise copper granules of approximately 30 μm in diameter. The mixture for the resin layer may comprise copper granules 2 of approximately 30 μm in granular diameter with polyimide precursor 3 at the volumetric ratio of one to one. In the second embodiment in discussion, an aqueous solution of potassium hydroxide is used as an etchant for removing a portion of the surface of the resin layer to expose the copper granules 2, as shown in FIG. 2, by selectively etching the surface of the resin layer of the resin material of polyimide precursor 3 with respect to the filler elements of copper granules. In the second embodiment in discussion, a mixed aqueous solution of ferric chloride and hydrochloric acid is used as an etchant for copper granules to remove the copper granules, as exposed, as seen in FIG. 2, by selectively etching the exposed copper granules with respect to the resin material of the polyimide resin 4 of the resin layer. Metal for filler elements of fine geometry may be of any other metal, such as aluminum, which can be etched by a suitable etchant but does not etch the resin material of the resin layer.

In accordance with another example of the foregoing second embodiment, metal granules having a melting point lower than the heat resisting temperature of a resin material being used is mixed with the resin material and the composite is adapted to undergo the same processes as previously described example of the second embodiment until the resin material is thermally set and the surface of the resin material is selectively etched with respect to the metal granules to expose a portion of the metal granules, whereupon the composite is heated to a temperature higher than the melting point of the above described metal granules, so that the metal granules may be melted and the molten metal of the filler elements, as exposed, may be removed. By carrying out an electroless plating process on the composite having the surface of the resin layer with the exposed metal granules removed, substantially the same result as that of the previously described example of the second embodiment is achieved. In the example of the second embodiment in discussion, polyimide precursor can be used as a resin material of the resin layer and a tin-lead alloy (such as tin/lead=6/4), tin or the like can be used as metal for filler elements of fine geometry.

In accordance with the second embodiment example in discussion, an advantage is brought about that the thermal conductivity of the resin material can be enhanced due to mixture of metal granules and hence thermal dissipation can be accordingly enhanced in the case where the composite in accordance with the example is utilized as a circuit board. Another feature of the second embodiment example in discussion is that a thermal expansion coefficient can be controlled by changing the amount, geometry and the like of the metal granules being mixed in the resin material.

Meanwhile, since the degree of unevenness of the surface of the resin layer can be readily controlled by changing the granular diameter, density, geometry, etching conditions and the like of the metal granules being mixed in the resin material, any desired surface conditions can be readily realized. In addition, removal of metal granules, as exposed, by chemical etching or fusion can be more readily done as compared with removal of an inorganic insulating material such as glass by etching thereof in accordance with the first embodiment, the productivity can be enhanced in accordance with the second embodiment in discussion.

The metal granules being mixed with the resin material may be hollow. In accordance with such example of employing the metal granules being hollow, advantages are brought about that the etching process of the metal granules can be readily done while the degree of unevenness of the etched surface of the resin layer can be increased, and control can be more readily made of the thermal expansion coefficient, dielectric constant and the like of the resin layer.

THIRD EMBODIMENT

The inventive composite having a conductive layer on the surface of a resin layer can be implemented in the form of a circuit board by forming the conductive layer in a predetermined pattern. Now a method of manufacturing a circuit board having a conductive layer of a predetermined pattern on the surface of a resin layer in accordance with the third embodiment of the present invention will be described in the following.

Figure 5:
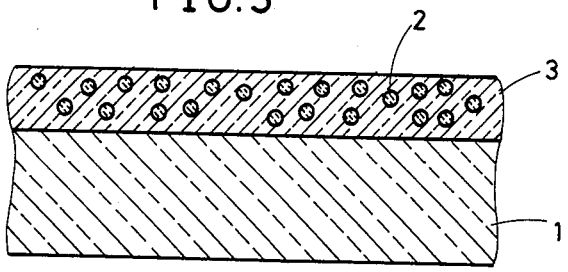
FIGS. 5 to 8 are sectional views of a circuit board at various steps of a manufacturing process in accordance with the present invention.
Figure 6:
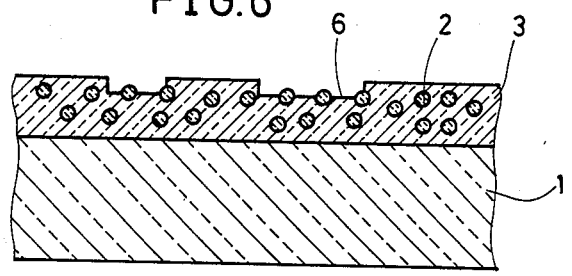
Figure 7:
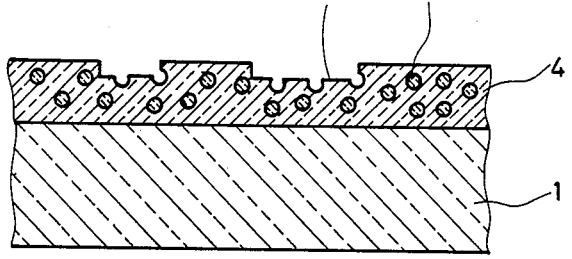
Figure 8:
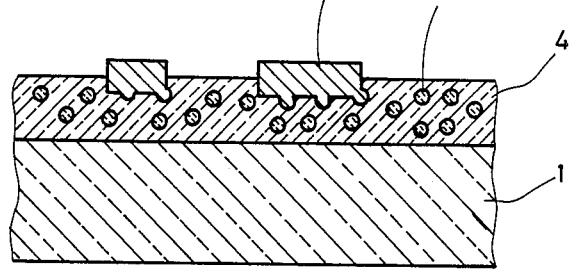

FIGS. 5 to 8 are sectional views of such circuit board at various steps of a manufacturing process in accordance with the third embodiment of the present invention. More specifically, FIG. 5 is a sectional view of the circuit board comprising a resin layer of a mixture of a resin material and filler elements of fine geometry formed on a substrate before a portion of the surface of the resin layer is etched, FIG. 6 is a sectional view of the circuit board after the surface of the resin layer is etched in a predetermined pattern to expose a portion of the filler elements therein, FIG. 7 is a sectional view of the circuit board after the exposed filler elements in the predetermined pattern are etched, and FIG. 8 is a sectional view of the circuit board with a conductive metal layer formed on the partially etched surface of the resin layer.

Referring to FIGS. 5 to 8, the reference numeral 1 denotes a substrate, which may comprise an alumina ceramic substrate, the reference numeral 2 denotes an inorganic insulating material, which may comprise glass granules, the reference numeral 3 denotes a resin material before thermal setting, which may comprise photosensitive polyimide precursor varnish, the reference numeral 4 denotes the resin material after thermal setting, which may comprise polyimide resin, the reference numeral 5 denotes a conductive metallic layer formed by a electroless plating method, which may comprise copper, and the reference numeral 6 denotes a groove formed in a predetermined pattern by partial etching of the resin material.

Now referring to FIGS. 5 to 8, a method of manufacturing a circuit board having a conductive layer of a predetermined pattern on the surface of a resin in accordance with the third embodiment of the present invention will be described. First a mixture is prepared by mixing a resin material 3 of polyimide precursor varnish with filler elements 2 of glass granules of approximately 10 $\mu$m in the granular diameter at volumetric ratio of two times with respect to polyimide precursor varnish. The glass granules are of a type being readily dissoluble by acid. The mixture of the polyimide precursor varnish 3 with glass granules 2 is coated on the alumina ceramic substrate 1. The polyimide precursor varnish 3 is dried at a temperature lower than a thermal setting temperature, in this case at 80° C., for thirty minutes. An area of a predetermined pattern of the resin layer of the mixture is then exposed to light using a mask of a correspondingly predetermined pattern and then the area of the predetermined pattern of the surface of the resin layer is slightly removed using as an etchant an organic solvent, such as N-methyl-2-pirolidone. As a result, the composite of such a structure as shown in FIG. 6 is obtained, wherein a portion of the glass granules 2 is exposed within the groove 6 in the predetermined pattern. To that end, the exposing and developing conditions are controlled. Then the composite is heated at 350° C. so that the resin material may be thermally set by a change from polyimide precursor varnish to polyimide resin 4.

The composite thus obtained is then subjected to an etching process by immersing the same in acid such as fluoric acid so that the portion of the glass granules 2 as exposed may be selectively etched with respect to the polyimide resin 4. More specifically, since the glass granules 2 being used in the example are susceptible to dissolution by acid while the polyimide resin 5 has excellent acid resisting properties, the glass granules exposed in the groove 6 of the predetermined pattern are selectively etched with respect to the resin material of the resin layer, whereby only the inner surface of the groove 6 has unevenness, including small concavities. Then an activating process is applied for electroless plating and catalyst nuclei are formed on the uneven surface in the groove 6 of the polyimide resin layer 4 for deposition of a conductive metallic layer through electroless plating. Then the composite thus obtained is immersed in an electroless plating bath. Then the composite is washed with water and rinsed with acid and the catalyst nuclei are removed while the same is left only in the inner surface of the groove 6 corresponding to the previously described predetermined pattern, whereupon the composite is immersed in an electroless plating bath. As a result, a circuit board of such a structure as shown in FIG. 8 is provided, wherein the conductive metal layer 5 is formed selectively only in the area of the predetermined pattern in the groove 6.

In accordance with the third embodiment in discussion, the glass granules 2 are mixed with the varnish 3 having a photosensitive property and the resin layer of the mixture thus obtained is formed and is selectively exposed in a predetermined pattern, so that the groove 6 is formed in the above described predetermined pattern so as to expose a portion of the glass granules in the groove 6 and then the glass granules 2 in the groove 6 of the resin layer are selectively etched with respect to the resin layer, whereby only the inner surface of the groove in the predetermined pattern is made to have unevenness. As a result, it becomes possible to form catalyst nuclei for electroless plating selectively in the inner surface of the groove 6 without forming a conventional resist pattern and also it becomes possible to form a conductive metallic layer 5 selectively only on the inner surface of the groove 6. As a result, a circuit board capable of achieving a large scale integration is provided at an inexpensive cost. In addition, since the conductive metallic layer is formed on the surface of the resin layer having unevenness, the adhesion of the conductive metallic layer to the resin layer is large and a circuit board of high reliability is provided.

In forming catalyst nuclei, selective formation of the catalyst nuclei may be made depending on the difference in the unevenness between the inner surface of the groove and the surface of the resin layer.

Although in the above described third embodiment polyimide resin as thermally set of polyimide precursor varnish was employed as a resin material of the resin layer, any other resin material may be used which can be coated in a varnish state and can be dried and has photosensitivity and can be etched in a desired pattern by exposure and development after the same is dried and is excellent in chemical resistance after thermal setting. For example, such material may comprise polyisoprene resin, phenol-formaldehyde resin, poly-metaerylate resin and the like. Meanwhile, even a resin material without having photosensitivity can be applied to achieve substantially the same effect, since the varnish can be selectively removed in a predetermined pattern by using a photoresist.

In the foregoing example, glass granules were used as an inorganic insulating material. However, the inorganic insulating material may comprise crystal of any other type of an inorganic insulating material which can be selectively etched without corroding the resin material of the resin layer and has heat resisting property at the resin thermo-setting temperature, such as metal oxide of such as magnesium oxide, stannum oxide or the like. In using an inorganic insulating material of crystal, the unevenness conditions of the surface of the etched surface in the groove can be more readily controlled by properly selecting the shape of the crystal and the advantage of the present invention is further increased. The filler elements of an inorganic insulating material may be in the form of granules but also in the form of fibers in order to achieve the same effect. It is pointed out that any other technical matters described in conjunction with the previously described first embodiment may be employed in the above described third embodiment, insofar as such are applicable, inasmuch as any technical matters can be equally applicable to those portions of the same structure, apart from provision of the groove 6 in the above described third embodiment.

FOURTH EMBODIMENT

In the above described third embodiment of the present invention, an inorganic insulating material such as glass or metal oxide of such as magnesium oxide, stannum oxide or the like in the form of granules or fibers was employed as the filler elements of fine geometry. However, this should be taken by way of example and not by way of limitation, inasmuch as substantially the same effect can be achieved by using metal in the form of granules or fibers as the filler elements of fine geometry. Such an embodiment of the inventive composite as employing metal as the filler elements of fine geometry was described in detail in conjunction with the second embodiment. It is pointed out that any technical matters in conjunction with employment of metal as the filler elements of fine geometry described in conjunction with the above described second embodiment can be equally applied to the fourth embodiment in discussion, apart from the difference in structure of presence of the groove 6 in the third embodiment. Hence, any description in conjunction with the second embodiment is incorporated in the fourth embodiment insofar as the same is applicable, and the same description is not repeated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a composite having a conductive layer on a surface of a resin layer, comprising the steps of preparing a substrate having a main surface, forming on said main surface of said substrate a resin layer comprising a mixture of a resin material and filler elements of fine geometry, said resin material being etchable with respect to said filler elements, said filler elements being etchable with respect to said resin material, selectively etching said resin material of the surface of said resin layer with respect to said filler elements to expose a portion of said filler elements, selectively etching said filler elements, as exposed on said selectively etched surface of said resin layer with respect to the resin material, to form unevenness including concavities formed as a result of etching of said exposed filler elements, forming catalyst nuclei for electroless plating on said selectively etched surface having said unevenness of said resin layer, and electroless plating a conductive metal layer on said selectively etched surface having said unevenness having said catalyst nuclei formed, wherein said resin material comprises a thermo-setting material being thermo-settable at a predetermined thermo-setting temperature, said resin material being etched with respect to said filler elements prior to thermo-setting of said resin material, said filler elements being selectively etched with respect to said resin material after said resin material has been thermo-set, and which further comprises the step of heating said resin material to said predetermined thermosetting temperature after said step of etching said resin material at the surface of said resin layer and before said step of selectively etching said filler elements, as exposed.

2. A method of manufacturing a composite in accordance with claim 1, wherein said filler elements are made of an inorganic insulating material.

3. A method of manufacturing a composite in accordance with claim 2, wherein said filler elements of said inorganic insulating material comprise glass powder.

4. A method of manufacturing a composite in accordance with claim 2, wherein said filler elements of said inorganic insulating material comprise crystal of said inorganic insulating material.

5. A method of manufacturing a composite in accordance with claim 2, wherein said filler elements of said inorganic insulating material comprise glass fibers.

6. A method of manufacturing a composite in accordance with claim 1, wherein said filler elements are made of metal.

7. A method of manufacturing a composite in accordance with claim 6, wherein said metal is a member selected from the group consisting of copper and aluminum, said filler elements being granule.

8. A method of manufacturing a circuit board having a conductive layer of a predetermined pattern on a surface of a resin layer, comprising the steps of
preparing a substrate having a main surface,
forming on said main surface of said substrate a resin layer comprising a mixture of a resin material and filler elements of fine geometry, said resin material being selectively etchable with repect to said filler elements, said filler elements being selectively etchable with respect to said resin material,
selectively etching the surface of said resin material layer in an area of the surface according to a predetermined pattern to expose a portion of said filler elements in said area in said predetermined pattern of the surface of said resin layer,
selectively etching said filler elements, as exposed on said selectively etched surface of said area in said predetermined pattern of said resin layer, to form unevenness therein including concavities formed as a result of etching of said exposed filler elements,
forming catalyst nuclei for electroless plating on said selectibely etched surface in said predetermined pattern of said resin layer having said unevenness of said resin layer, and
electroless plating selectively a conductive metal layer on said selectively etched surface in said predetermined pattern having said unevenness having said catalyst nuclei formed,
wherein said resin material comprises a thermo-setting material being thermo-settable at a predetermined thermo-setting temperature, said resin material being etched with respect to said filler elements prior to thermo-setting of said resin material, said filler elements being selectively etched with respect to said resin meaterial following thermo-setting of said resin material, and which thereby further comprises the step of
heating said resin material to said predetermined thermosetting temperature after said step of selectively etching said resin material on the surface of said resin layer and before said step of selectively etching said filler element, as exposed.

9. A method of manufacturing a circuit board in accordance with claim 8, wherein said filler elements are made of an inorganic insulating material.

10. A method of manufacturing a circuit board in accordance with claim 9, wherein said filler elements of said inorganic insulating material comprise glass powder.

11. A method of manufacturing a circuit board in accordance with claim 9, wherein said filler elements of said inorganic insulating material comprise crystal of said inorganic insulating material.

12. A method of manufacturing a circuit board in accordance with claim 9, wherein said filler elements of said inorganic insulating material comprise glass fibers.

13. A method of manufacturing a circuit board in accordance with claim 8, wherein said filler elements are made of metal.

14. A method of manufacturing a circuit board in accordance with claim 13, wherein said metal is a member selected from the group consisting of copper and aluminum, said filler elements being granule.

* * * * *